US012572770B2

(12) United States Patent (10) Patent No.: US 12,572,770 B2
Kang et al. (45) Date of Patent: Mar. 10, 2026

(54) TRACKING SYSTEM ON MATRIX TWO-DIMENSIONAL CODE LABELS

(71) Applicant: Applied Materials, Inc., Santa Clara, CA (US)

(72) Inventors: Hung-Sen Kang, Sunnyvale, CA (US); Chih-Yang Chang, Santa Clara, CA (US); Yao-Hung Yang, Santa Clara, CA (US); Yixing Lin, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 34 days.

(21) Appl. No.: 18/796,901

(22) Filed: Aug. 7, 2024

(65) Prior Publication Data

US 2026/0044699 A1 Feb. 12, 2026

(51) Int. Cl.
*G06K 19/06* (2006.01)
*G03F 7/00* (2006.01)

(52) U.S. Cl.
CPC ... *G06K 19/06037* (2013.01); *G03F 7/70683* (2013.01); *G03F 7/70925* (2013.01)

(58) Field of Classification Search
None
See application file for complete search history.

(56) References Cited

U.S. PATENT DOCUMENTS 7,510,124 B2 3/2009 Barker et al.
7,665,661 B2 2/2010 Wang 10,923,215 B2 2/2021 Witchey et al.
2005/0070104 A1* 3/2005 O'Meara ........... H01L 21/67276
438/689
2020/0192325 A1 6/2020 Sadeghi et al.
2021/0010138 A1 1/2021 Bode et al.
2022/0020565 A1 1/2022 Liao et al.
2022/0238355 A1* 7/2022 Plavidal ........... H01L 21/67028
(Continued)

OTHER PUBLICATIONS

Chien et al., A Design for Selective Wet Etching of Si3NA/SiO2 in Phosphoric Acid Using a Single Wafer Processor, Journal of the Electrochemical Society, 165, published Mar. 22, 2018, Taiwan, 5 pages.

(Continued)

*Primary Examiner* — Kristy A Haupt
(74) *Attorney, Agent, or Firm* — Moser Taboada

(57) ABSTRACT

A method for tracking of a semiconductor chamber part uses a matrix two-dimensional (2D) code label embedded with a tracking feature. In some embodiments, the method may include selecting a feature to embed into the matrix 2D code label to create a modified matrix 2D code label where the feature does not cause misreading of information from the matrix 2D code label when embedded into the matrix 2D code label and where the feature is configured to change based on treatment of the semiconductor chamber part, forming the modified matrix 2D code label into the semi-conductor chamber part, optically inspecting the modified matrix 2D code label to determine changes to the feature, and analyzing the changes to the feature to determine a number of cleaning cycles undergone by the semiconductor chamber part based, at least in part, on the changes to the feature.

20 Claims, 6 Drawing Sheets

(56) References Cited

U.S. PATENT DOCUMENTS

2024/0145281 A1    5/2024   Salinas et al.

OTHER PUBLICATIONS

ByteScout Team of Writers, Data Matrix: History, Advantages, Limitations, Usage, https://bytescout.com/blog/2013/10/data-matrix. html, Jun. 12, 2024, 6 pages.
PCT International Search Report and Written Opinion for PCT/US2025/039827 dated Dec. 1, 2025.

* cited by examiner

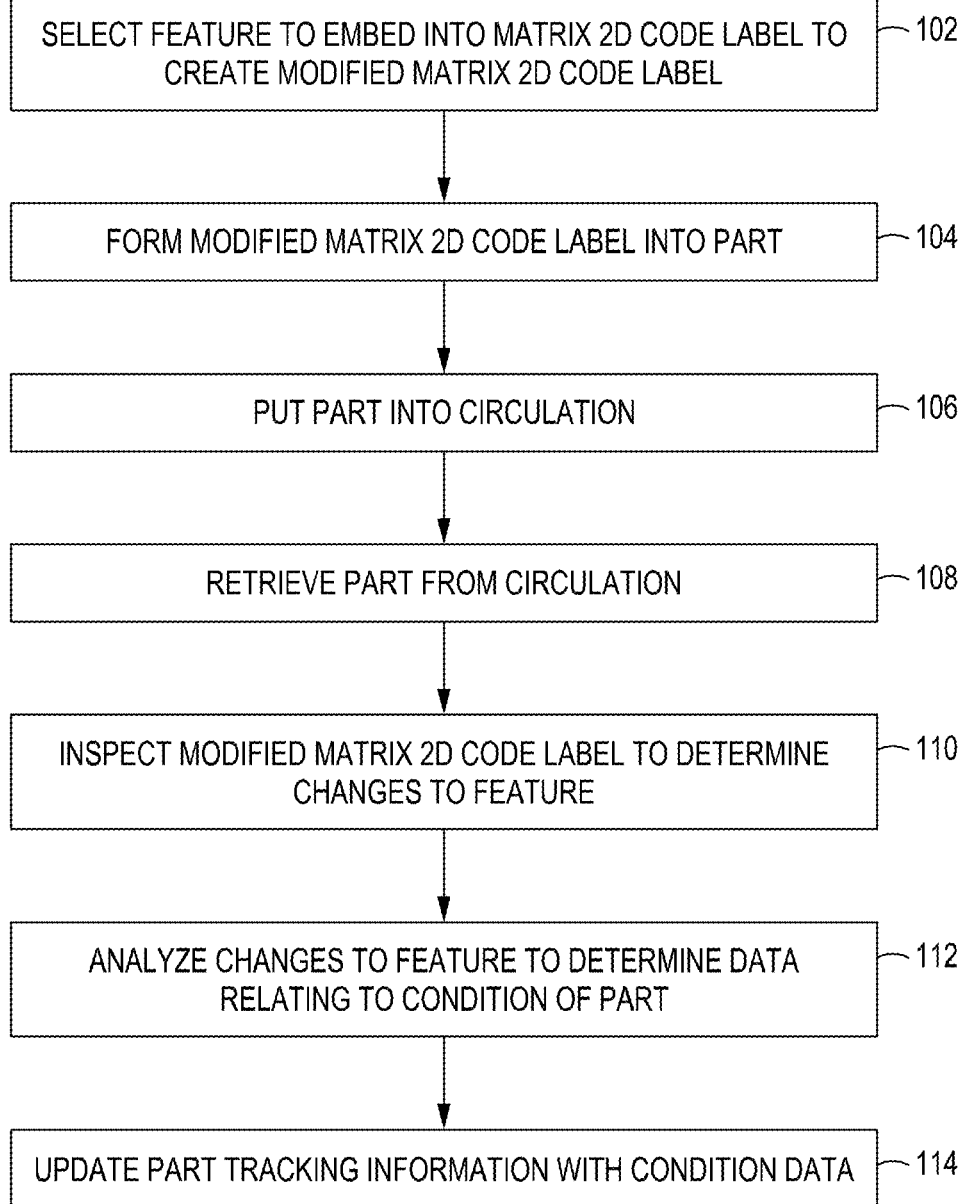

SELECT FEATURE TO EMBED INTO MATRIX 2D CODE LABEL TO CREATE MODIFIED MATRIX 2D CODE LABEL ∼102

FORM MODIFIED MATRIX 2D CODE LABEL INTO PART ∼104

PUT PART INTO CIRCULATION ∼106

RETRIEVE PART FROM CIRCULATION ∼108

INSPECT MODIFIED MATRIX 2D CODE LABEL TO DETERMINE CHANGES TO FEATURE ∼110

ANALYZE CHANGES TO FEATURE TO DETERMINE DATA RELATING TO CONDITION OF PART ∼112

UPDATE PART TRACKING INFORMATION WITH CONDITION DATA ∼114

FIG. 1

TRACKING SYSTEM ON MATRIX TWO-DIMENSIONAL CODE LABELS

FIELD

Embodiments of the present principles generally relate to semiconductor processing of semiconductor substrates.

BACKGROUND

Equipment used in semiconductor processing often includes parts that may need to be periodically cleaned to ensure the overall performance of the equipment. Deposition and etching processes can cause unwanted films or coatings to develop on parts exposed to the process volume of a semiconductor chamber. The coatings may reduce the effectiveness of grounding at the part or cause buildup and flaking that generates particles that damage semiconductor structures formed on the substrates. Typically, the parts undergo a set number of cleaning cycles before being completely replaced with a new part. A manufacturer of the part may determine the maximum number of cleaning cycles based on acceptable tolerances and/or material makeup of the part. The part may even be warranted by the manufacturer for a specific number of cleaning cycles. Thus, accurate tracking of the number of cleaning cycles is important, not only to the manufacturer for warranty reasons, but also to the user of the part to ensure that process tolerances are maintained so that yields are not impacted. However, the inventors have observed that often the actual number of cleaning cycles is not accurately known due to miscommunications between users and manufacturers, loss of data tracking information, and/or misrepresentation of the number of cleaning cycles to keep parts within specified warranties, and similar.

Accordingly, the inventors have provided methods for tracking of semiconductor parts that is independent of user supplied data.

SUMMARY

Methods for improving tracking of semiconductor process chamber parts are provided herein.

In some embodiments, a method for tracking of a semiconductor chamber part may comprise selecting a feature to embed into a matrix two-dimensional (2D) code label to create a modified matrix 2D code label where the feature does not cause misreading of information from the matrix 2D code label when embedded into the matrix 2D code label and the feature is configured to change based on treatment of the semiconductor chamber part and forming the modified matrix 2D code label into the semiconductor chamber part.

In some embodiments, the method may further include optically inspecting the modified matrix 2D code label to determine changes to the feature and analyzing the changes to the feature to determine a number of cleaning cycles undergone by the semiconductor chamber part based, at least in part, on the changes to the feature, optically inspecting the modified matrix 2D code label which includes reviewing the modified matrix 2D code label with a naked eye, an optical microscope, or a metrology tool, analyzing the changes to the feature which includes using a machine learning process to infer information regarding the number of cleaning cycles undergone by the semiconductor chamber part, analyzing the changes to the feature which includes, at least in part, accounting for a type of chemical used in a cleaning cycle, selecting the feature based, at least in part, on a type of chemical used in a cleaning cycle of the semiconductor chamber part, selecting the feature based, at least in part, on a type of material of the semiconductor chamber part, a feature that changes dimensionally with each cleaning cycle of the semiconductor chamber part, a feature which comprises a plurality of sub-features where a dimensional change in one or more of each individual sub-feature indicates a predetermined number of cleaning cycles, a feature that is positioned at least on a plateau of the matrix 2D code label to form the modified matrix 2D code label, a feature that is positioned at least one a recess of the matrix 2D code label to form the modified matrix 2D code label, a matrix 2D code label that is a data matrix 2D bar code with ECC 200 error correction correctable with damage of 30% or less, and/or a semiconductor chamber part that is formed of silicon, silicon carbide, aluminum, anodized aluminum, aluminum nitride, stainless steel, anodized stainless steel, aluminum nitride, aluminum oxide, polyether ether ketone (PEEK), titanium, or quartz.

In some embodiments, a method for tracking cleaning cycles of a semiconductor chamber part may comprise inspecting a modified matrix two-dimensional (2D) code label with a feature that does not cause misreading of information from the matrix 2D code label when embedded into the matrix 2D code label, determining a change to the feature after the semiconductor chamber part has been used in a semiconductor process and subsequently cleaned, and determining a number of cleaning cycles undergone by the semiconductor chamber part based, at least in part, on the changes to the feature.

In some embodiments, the method may further include inspecting the modified matrix 2D code label which includes reviewing the modified matrix 2D code label with a naked eye, an optical microscope, or a metrology tool, determining the number of cleaning cycles which includes using a machine learning process to infer information regarding the number of cleaning cycles undergone by the semiconductor chamber part based, at least in part, on the change to the feature, determining the number of cleaning cycles which includes, at least in part, accounting for a type of chemical used in a cleaning cycle of the semiconductor chamber part or a type of material of the semiconductor chamber part, a feature that changes dimensionally with each cleaning cycle of the semiconductor chamber part, and/or a feature comprises a plurality of sub-features where a dimensional change in one or more of each individual sub-feature indicates a predetermined number of cleaning cycles.

In some embodiments, a non-transitory, computer readable medium having instructions stored thereon that, when executed, cause a method for tracking of a semiconductor chamber part to be performed, the method may comprise selecting a feature to embed into a matrix two-dimensional (2D) code label to create a modified matrix 2D code label where the feature does not cause misreading of information from the matrix 2D code label when embedded into the matrix 2D code label and the feature is configured to change based on treatment of the semiconductor chamber part and forming the modified matrix 2D code label into the semiconductor chamber part.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 1 is a method for tracking parts in accordance with some embodiments of the present principles.

Figure 2:
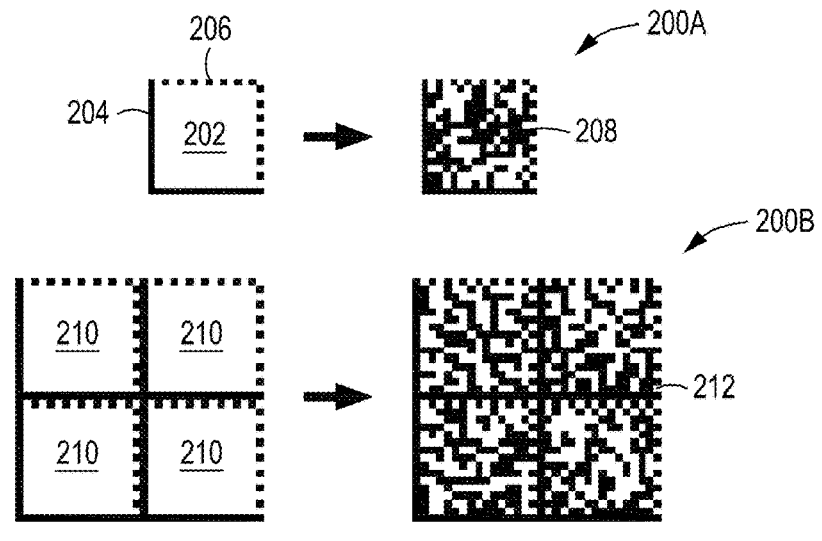
FIG. 2 depicts a top-down view of a matrix two-dimensional (2D) barcode in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide improved accuracy in the tracking of parts used in semiconductor process chambers. The tracking methods leverage an up to 30% error correction capability of a matrix two-dimensional (2D) code to provide tracking features within the matrix 2D code label on the semiconductor part. By incorporating the tracking feature within a barcode label, minimal cost is incurred to enhance the part label's function for recycle clean tracking, for example, as well as the code's primary function as a part identification code label. The enhanced part label may also be used as a low-cost method of indicating a part's status such as, for example, new, like-new, used, or end-of-life, by using a tracking feature. The tracking feature interpretation or meaning can also be made proprietary for authentication and verification purposes such as revealing counterfeit code labels, counterfeit parts, and/or part tampering.

Examples used herein utilize the tracking feature to indicate a number of recycle cleans for a semiconductor part for the sake of brevity. However, the methods of the present principles are not limited only to tracking the number of recycle cleans of a semiconductor part and may be used to solely track a part, to authenticate a part, to verify a part's history, to determine a condition status of a part (e.g., new, used, etc.), or a combination of any of the above, and the like.

Traditionally, a user or consumer of a part uses the part until a preventive maintenance schedule indicates that the part should be removed from a process chamber and sent out for cleaning. A recycler cleans the part using chemicals to etch and remove unwanted coatings/films from the part until the part is again within specifications determined by the manufacturer. The manufacturer may be notified by the consumer and/or the recycler that the part is undergoing cleaning and associated data such as the date, the part identification/serial number, the type of cleaning process, and other associated information. However, what has been is that when the manufacturer receives the cleaned part, the data relevant to the cleaning process is often missing (e.g., data or records lost by consumer or recycler, etc.), invalid (e.g., serial number is for another part, etc.), or only partial in nature (e.g., serial number but no date or cleaning process information, etc.). The manufacturer then incurs additional costs in time and effort to attempt to track down information from recyclers/consumers and/or to test the part to determine the part performance before the part can be reused.

The methods of the present techniques provide positive indications of, for example, a number of cleaning cycles and the like without requiring external information from consumers or recyclers or other suppliers. Although not required, external information may be used to enhance the tracking process. In some embodiments, the part may be visually checked without the need for computers or other equipment, substantially shortening the verification and/or part condition status process. The present methods allow for a quick determination of the condition of the part, saving time and effort and reducing costs. Missing information relevant to the part's performance can be determined, and the data recovered via a tracking feature to complete the records for the part history along with authentication of the part.

In brief, with the present techniques, when a new part is manufactured, an additional tracking feature is added to a plateau and/or recess of a matrix 2D code label that is formed into the new part. The modified matrix 2D code label may be formed into the part by laser etching, machining, molding, or chemical etching and the like. The modified matrix 2D code label is compatible with, but not limited to, materials such as silicon, silicon carbide, anodized aluminum, anodized stainless steel, aluminum nitride, ceramics (e.g., alumina or $Al_2O_3$, etc.), polyether ether ketone (PEEK), titanium, aluminum, quartz, and stainless steel and the like. The part can then be circulated or shipped between consumer, recycler, and manufacturer, etc. In some embodiments, inspection of the feature of the modified matrix 2D code label may be accomplished by naked eye and/or under a microscope to determine a status/condition of the part. Changes to the feature can be determined to reveal, for example, the remaining life of the part and/or the part's current performance status, etc. In some embodiments, metrology tools may be used to scan the feature and/or a machine learning or artificial intelligence process may be used to assist in determining the condition and to analyze the feature to obtain or infer additional information about the part. FIG. 1 is a method 100 for tracking of a part such as, but not limited, a semiconductor chamber part and the like. For the sake of brevity, examples of tracking a part for semiconductor manufacturing are used in the context of tracking a number of cleaning cycles undergone by the part. However, the method 100 may also be used for tracking of other aspects of a part besides the number of cleaning cycles and may also be used to track other types of equipment and/or parts and similar. In addition, the present techniques may also be used for verification of the authenticity of a part or equipment and the like using hidden feature information in the matrix 2D code label.

Figure 6:
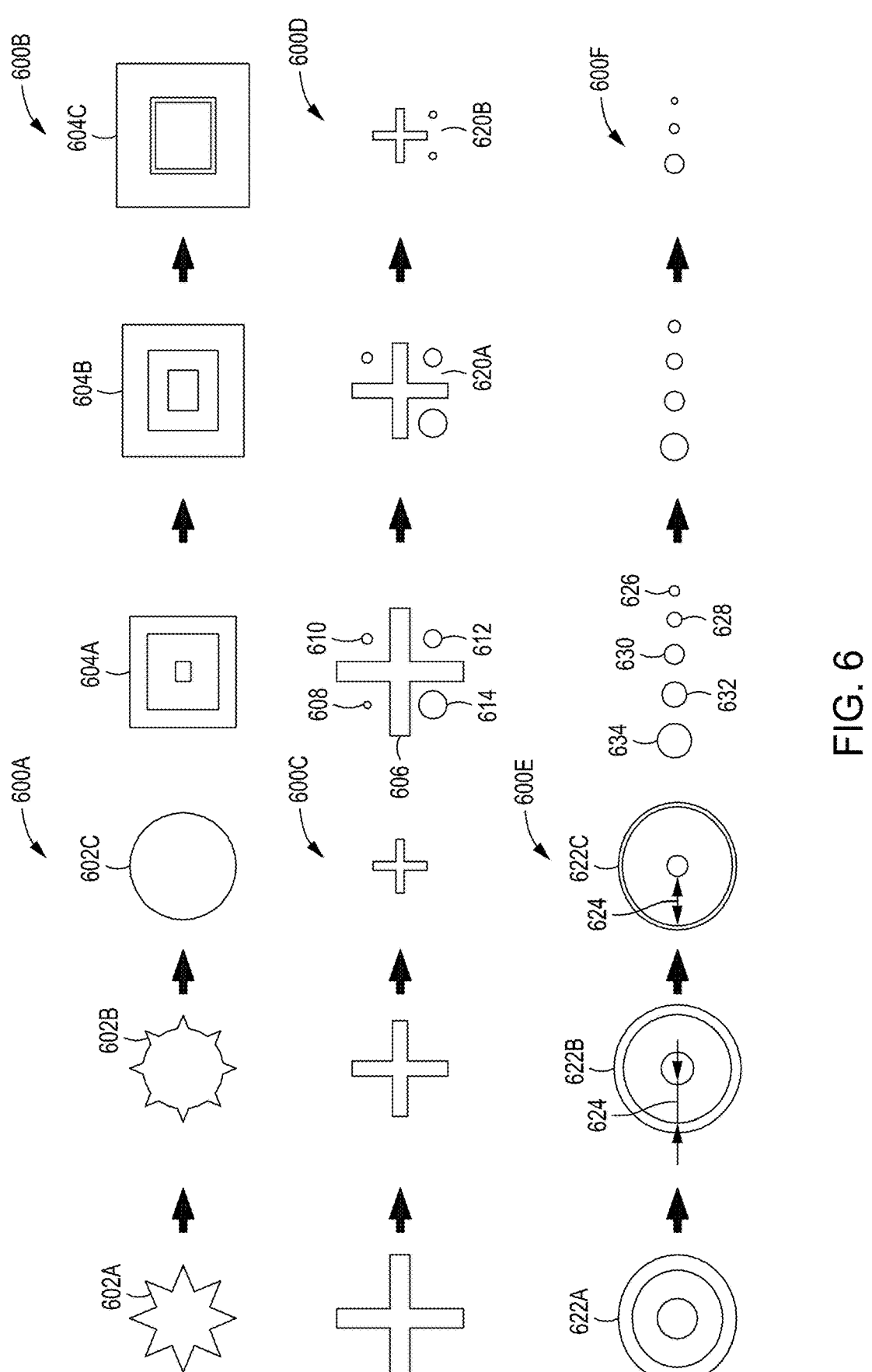
FIG. 6 depicts top-down views of feature sets and shapes in accordance with some embodiments of the present principles.

In block 102, a feature is selected to embed into the matrix 2D code label to create a modified matrix 2D code label. As used herein, a feature is a raised portion of a recess area and/or a raised portion of a plateau area within the matrix 2D code label. A feature set may be comprised of a single feature or a plurality of sub-features (e.g., see examples in FIG. 6). In some embodiments, more than one feature may be embedded into the matrix 2D code label at different positions and/or heights within the label. The feature may have a single or a plurality of different heights (e.g., a stair step-like feature (see, e.g., third feature 414 of FIG. 4) or sub-features with different heights). The feature is an addition to the recesses and plateaus of the encoded data of the matrix 2D code label and is not meant to be read or interpreted by a barcode reader as encoded data (e.g., the feature may be interpreted by the code reader as an error). A matrix 2D code label, as defined herein, is a two-dimensional (length×width) bar code with a third dimension (height) that provides recesses and plateaus within the matrix 2D code label that can be interpreted optically by a 2D bar code scanner. The height dimension is relative to a surface of a part and may be below the surface of the part and/or above the surface of the part.

The selection of the feature may be based on use of a part (e.g., type of semiconductor process, a number of cleaning cycles, etc.), authentication of a part (e.g., hidden information only known to the manufacturer, etc.), and/or exposure of a part to certain environments, and the like. Selection of the amount of the area of the matrix 2D code label that may be used for the feature is also limited by the type of error correction used, as the embedded feature cannot cause data loss of the incorporated data of the matrix 2D code label. In some embodiments, the matrix 2D code label may use, but is not limited to, a Data Matrix type ECC 200 code (ISO/IEC 16022) to incorporate information into the matrix 2D code label. ECC 200 has robust error correction with a high tolerance for errors (no data loss with up to approximately 30% of code obscured). The high tolerance allows for an increased amount of feature area that can be used in the matrix 2D code label without irreparably corrupting the data and causing data loss in the matrix 2D code label. Other types of matrix 2D codes may be used as well as other types of error correction. The amount of available feature area may be adjusted based on the error correction type and the type of matrix 2D code used in the matrix 2D code label. In general, matrix 2D codes is used due to the high density of information that may be encoded into the label.

FIG. 2 is an example of a Data Matrix 2D barcode that may be used as the encoding basis for the matrix 2D code label of the present techniques. Barcodes are optically read based on contrasts between light or white areas and dark or black areas. The present techniques provide the contrast needed to read the barcode by using high areas or plateaus for 'white' areas and low areas or recesses for 'dark' areas. The differences in height of the high and low areas creates a contrast between the areas that allow a barcode that is embedded in a single-color material to be read easily by an optical scanner. In some embodiments of the present principles, the low areas or recesses may be coated to enhance the contrast, or the high areas or plateaus may be coated to enhance the contrast or both high and low areas may be coated with different color coatings to enhance the contrast. Although the barcode appears as a two-dimensional matrix when viewed from above, the barcode has a third dimension when viewed from a cross-section as depicted in a view 300B of FIG. 3. The third dimension (height) provides the contrast to enable light/dark area coding of the barcode.

In a view 200A of FIG. 2, the data area 202 of the Data Matrix barcode is surrounded by an L-shaped frame 204 or alignment pattern and dotted lines 206 or a clock pattern. Barcode readers capture the patterns 208 to determine the position of the code using optical scanners and image processing. The layout of the Data Matrix 2D barcode allows for the code to be read in any direction. The Data Matrix 2D barcode includes 24 different code sizes ranging from 10×10 modules to 144×144 modules in square or rectangular patterns. If the barcode has a size larger than 24×24, the barcode is divided into blocks 210 that do not exceed the 24 modules on a side to form a completed label 212. By dividing the barcoded information into different blocks, distortion of the barcode is prevented, reducing/eliminating loss of data during scanning. A Reed-Solomon process is used to restore data from the barcode label when any part of the Data Matrix 2D code in the barcode label is damaged/missing.

Figure 3:
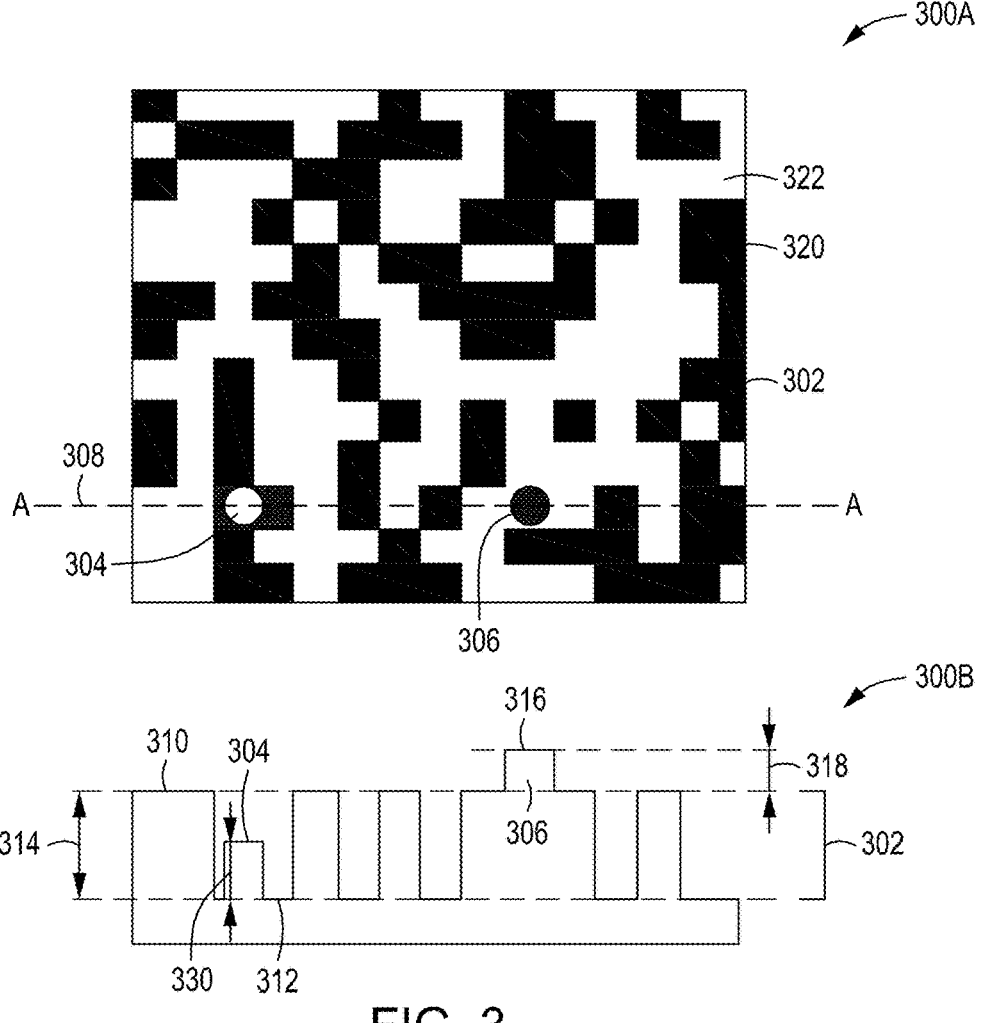
FIG. 3 depicts a top-down and a cross-sectional view of a portion of a modified matrix 2D code label in accordance with some embodiments of the present principles.

In a top-down view 300A of FIG. 3, a portion of a matrix 2D code label 302 is depicted. In the example of FIG. 3, a feature set including a first feature 304 and a second feature 306 is embedded into the portion of the matrix 2D code label 302. The features are contrasted in different shadings (light and dark, respectively) solely for ease of depiction against the matrix 2D code label 302. The shading of the features is not meant to indicate that the features are high or low areas. In addition, the features are depicted as circular, but the features are not limited to only circular-shaped areas. In the example, the first feature 304 is formed in a low or a recess area 320 of the matrix 2D code label 302. The second feature 306 is formed in a high or plateau area 322 of the matrix 2D code label 302. A cross-sectional view 300B of FIG. 3 depicts the portion of the matrix 2D code label 302 at the cutline A-A 308 of the top-down view 300A. The matrix 2D code label 302 has a contrast height 314 measured from the recess surface 312 to the plateau surface 310. In the example, the first feature 304 has a height 330 greater than the recess surface 312 and less than the plateau surface 310. In some embodiments, the first feature 304 may have a height equal to or greater than the contrast height 314 between the recess surface 312 and the plateau surface 310 or any height in between the recess surface 312 and the plateau surface 310. The height 330 of the first feature 304 may vary dependent on how the first feature 304 is used in the present methods (e.g., increase in height may allow the feature to indicate a greater number of cleaning cycles than a feature of lesser height, etc.). The second feature 306 is formed on the plateau surface 310 and has an upper surface 316 that is higher than the plateau surface 310. The height 318 of the second feature 306 may vary dependent on how the second feature 306 is used in the present methods.

Figure 4:
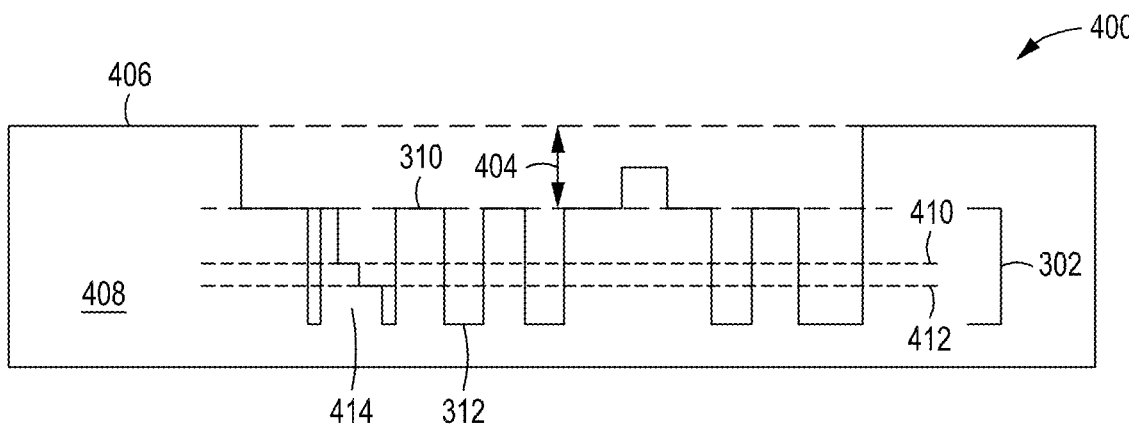
FIG. 4 depicts a cross-sectional view of a recessed, modified matrix 2D code label in accordance with some embodiments of the present principles.

In some embodiments, as depicted in a cross-section view 400 of FIG. 4, the plateau surface 310 of the matrix 2D code label 302 may be below a surface 406 of a part 408 by a given height 404. In some instances, recessing the matrix 2D code label 302 helps to protect the label from being damaged during shipping and/or handling of the part (e.g., during installation and/or removal, etc.). In the example, a third feature 414 is depicted having a first height 412 above the recess surface 312, a second height 410 above the recess surface 312, and a third height at the plateau surface 310. In some embodiments, variations in heights of a single feature or variations in heights of a plurality of features may be used to determine the use of a part (e.g., number of cycles of cleaning, etc.) as lower heights may be removed or become obscured quicker than higher heights of the features. Thus, the height or heights of the features is part of the feature selection process and can be based on detection and/or desired granularity of part usage.

The profile of the feature may be selected to further aid in part usage, and/or the profile may be dictated by the process in which the matrix 2D code label is formed in the part. In a view 500A of FIG. 5, the feature has been either intentionally formed with sides 504 of less than 90 degrees 506 or formed as such due to the process used to form the label into the part. If the feature is used to track usage that involves the part undergoing etching processes (e.g., to clean the part, etc.), the slope of the sides 504 may cause the surface 502 of the feature to increase in width as the feature is eroded by etching. A priori knowledge of the etchant (chemicals used) and duration of the etching process along with the type of material of the feature, the surface 502 will have an increase in width to a second width 508 for a first number of etching or cleaning cycles. Similarly, if the etching or cleaning cycles continue, the second width 508 will increase to a third width 510 for a second number of etching or cleaning cycles. Thus, the height and/or width of the feature can be analyzed and used to determine the actual number of etching or cleaning cycles that a part has undergone and the like.

Figure 5:
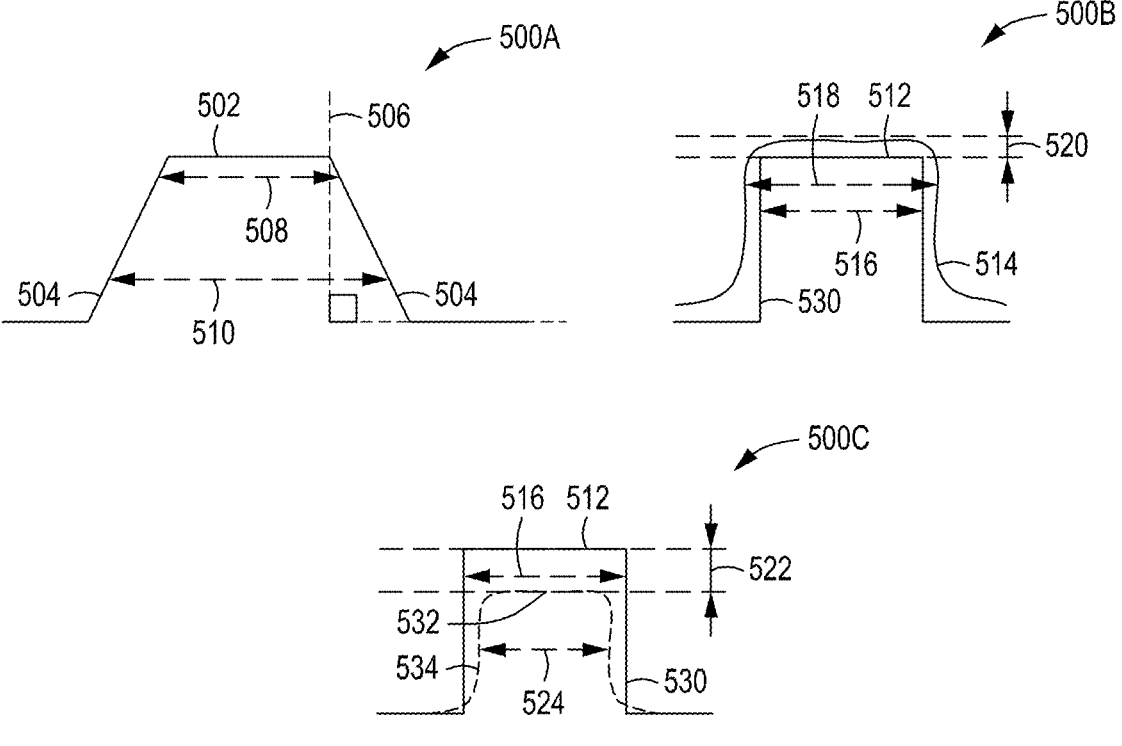
FIG. 5 depicts cross-sectional views of feature changes in accordance with some embodiments of the present principles.

In a view 500B of FIG. 5, a feature has perpendicular sides 530 with a first width 516. In the example, as the part undergoes usage/recycling, the surface 512 is oxidized forming an oxidation layer 514 on the feature causing an increase in the first width 516 to a second width 518, greater than the first width 516, and an increase 520 in height above the surface 512. The change in height and/or width can then be analyzed to determine how the part has been used or processed. In some instances, the feature may actually diminish in size 534 (height changes, width changes, length changes, etc.) due to the material of the part and/or the processes in which the part is used as depicted in a view 500C. The surface 512 of the feature has been eroded (change in height 522) to a second surface 532, and the first width 516 has been eroded to a third width 524, less than the first width 516. Thus, the change of the feature, whether positive or negative in area and/or height, is key to determining how the part has been used, what environments the part has been exposed to, and/or how many times a part has undergone a particular process and the like.

The feature selection may also include a particular shape to facilitate in analyzing the history of the part. With a priori knowledge of the intended use, processes undergone by the part, and part materials, etc., a feature's shape can be selected to indicate the desired data and the desired granularity of the data more easily and quickly (e.g., every 1 cleaning cycle, every 50 cleaning cycles, every 1000 cleaning cycles, etc.). In a top-down view 600A of FIG. 6, a feature with a star-shape, for example, is selected to track processing that leads to increased dimensions of the feature. The initial state 602A has changed to an intermediate state 602B, and to a final state 602C. The shape affords some easy optical granularity (e.g., does the star have any points left) between the intermediate state 602B (e.g., visible points indicate part has a portion of 50 cleaning cycle life remaining) and the final state 602C (e.g., the star has no points left—no cleaning cycles remain, end-of-life, discard part). In a top-down view 600B of FIG. 6, a feature with a box-within-a-box shape, for example, is selected to track processing that leads to increased dimensions of the feature. The initial state 604A has changed to an intermediate state 604B, and to a final state 604C. The shape affords some easy optical granularity (e.g., has the inner box and outer box joined together) between the intermediate state 602B (e.g., easy discernment between inner and outer boxes indicates part has a portion of 50 cleaning cycles remaining) and the final state 602C (e.g., borders of inner box and outer box hard to discern—no cleaning cycles remain, end-of-life, discard part).

The selection of the feature may also encompass an additional function not necessarily directly related to the tracking of the part. In a top-down view 600C, the feature is used as both an alignment mark and as an indicator of how the part has been used in processes that reduce (or in other embodiments, increase) the size of the feature. As the feature gets smaller, the alignment mark can be analyzed to determine the status of the part (e.g., number of process cycles, exposure to harsh environments, etc.). In a top-down view 600D, a feature includes sub-features (the alignment mark 606 plus four sub-features 608-614). As an example of feature selection for processes where the feature size is diminished with each process, the first sub-feature 608 is the smallest (e.g., indicates 1 cycle of cleaning to distinguish if the part has ever been used, etc.), the second sub-feature 610 is slightly larger (e.g., indicates 10 cycles of cleaning, etc.), the third sub-feature 612 is even larger (e.g., indicates 25 cycles of cleaning, etc.), and the fourth sub-feature 614 is the largest (e.g., indicates end-of-life of the part, 50 cycles of cleaning). In the intermediate state 620A, the first sub-feature 608 is visually missing, indicating that the part has been used in the example. In the final state 620B, the second sub-feature 610 is also missing, indicating that the part has undergone 10 cycles of cleaning and has not reached 25 cycles of cleaning (third sub-feature 612 is still present) in the example.

In a top-down view 600E, a feature has a first sub-feature surrounding a second sub-feature in an initial state 622A where the feature will be subjected to processes/environments where the feature will get smaller with more and more exposure. In an intermediate state 622B, the distance 624 between the sub-features has increased while the area (size) of each of the sub-features has decreased. In a top-down view 600F of FIG. 6, a feature set has been selected for using with a part where the features will diminish in size with use. Similar to the top-down view 600D, the sub-features are sized to indicate a number of processes or exposures to harsh environments and the like. Each of the sizes of the sub-features can be selected based on a priori knowledge to facilitate in easy discernment of a number of uses and with any amount of granularity desired (e.g., absence of first sub-feature 626 is 1 use, second sub-feature 628 is 2 uses, third sub-feature 630 is 3 uses, fourth sub-feature 632 is 4 uses, fifth sub-feature 634 is 5 uses or absence of first sub-feature 626 is 1 use, second sub-feature 628 is 10 uses, third sub-feature 630 is 100 uses, fourth sub-feature 632 is 1000 uses, fifth sub-feature 634 is end-of-life, 10,000 uses, etc.).

Figure 7:
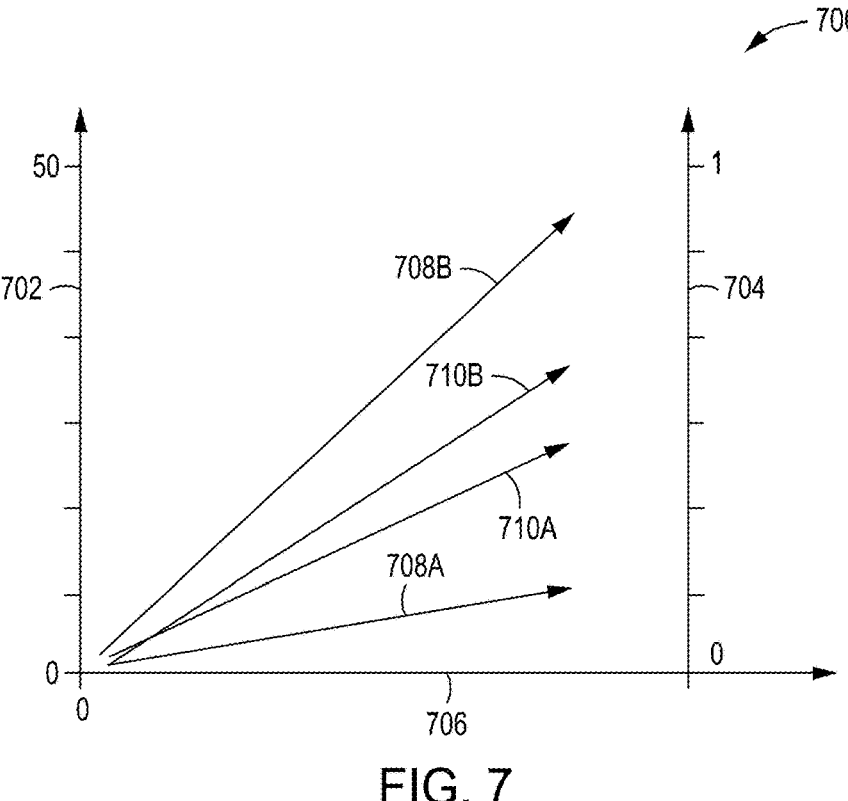
FIG. 7 depicts a graph of etching rates for two different materials in accordance with some embodiments of the present principles.

The feature selection can be based, at least in part, on a priori knowledge of how the part will be used, the material of the part, and other information (e.g., types of processes, chemical used, harshness of environment exposure, etc.) to determine the size of the feature (length, width, height), the location (position) of the feature within the matrix 2D code label, and the granularity of the data that can be gleaned from the feature. Factors such as type of etching performed for cleaning (e.g., anisotropic etch, isotropic etch, selectivity of etchant to material being etched, etc.) have an impact on the feature changes. A graph 700 of FIG. 7 depicts an example of how the type of material of the part and how the process chemicals affect the feature's dimensions with each cycle of use. A left axis represents an etch amount of a first material 702 which increases in the upward direction. A right axis represents an etch amount of a second material 704 which increases in the upward direction. The bottom axis 706 represents a process time which increases from left to right in the graph 700. Line 708A indicates an etch rate for the first material 702 without heat. Line 708B indicates an etch rate for the first material 702 with heat added during the etching process. Similarly, line 710A indicates an etch rate for the second material 704 without heat and line 710B indicates an etch rate for the second material with heat added during the etching process.

In comparison, the first material 702 is etched significantly faster than the second material 704 for a given amount of process time. Thus, the material of the part has a significant impact on the selection criteria of the feature for each different type of material. In addition, how the process is performed (with or without added heat during the process) also greatly impacts the etch rate for each type of material. Since the etch rates are significantly different depending on whether heat is added during the processing, feature sizes can be selected to indicate if the etching is being performed per the manufacturer's required procedures for warranty validation, etc. As discussed above and below, the data gleaned from the feature can be adjusted based on what type of information is to be tracked for a given part and easily adjusted for future parts manufactured by adjusting the feature within the matrix 2D code label without consumers or suppliers being able to interpret the data indicated by the features.

Figure 8:
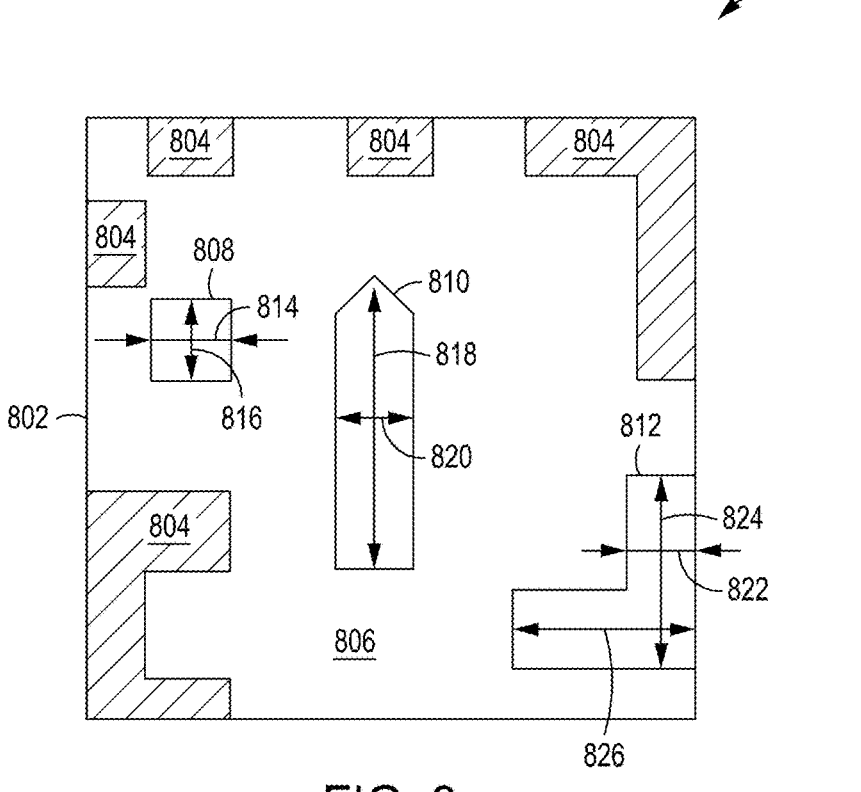
FIG. 8 depicts a modified matrix 2D code label undergoing cleaning cycles in accordance with some embodiments of the present principles.

FIG. 8 depicts a top-down view 800 of a modified matrix 2D code label 802 undergoing cleaning cycles. A recessed area 806 has plateau areas 804 that represent coded data in the matrix 2D code label 802. A feature set with a first sub-feature 808, a second sub-feature 810, and a third sub-feature 812 were subjected to a first number of cleaning cycles and a second number of cleaning cycles, greater than the first number of cleaning cycles. The first sub-feature 808 had an approximately 15% increase in both width 814 and length 816 after the first number of cleaning cycles. The second sub-feature 810 had an approximately 5% increase in width 820 and an approximately 2.5% increase in height 818 after the first number of cleaning cycles. The third sub-feature 812 had an approximately 15% increase in a first width 822, an approximately 10% increase in a second width 826, and an approximately 1% increase in length 824 after the first number of cleaning cycles. The first sub-feature 808 had an approximately 20% increase in both width 814 and length 816 after the second number of cleaning cycles. The second sub-feature 810 had an approximately 10% increase in width 820 and an approximately 5% increase in height 818 after the second number of cleaning cycles. The third sub-feature 812 had an approximately 25% increase in a first width 822, a slight increase in a second width 826, and an approximately 2.5% increase in length 824 after the second number of cleaning cycles. Thus, the shape of the feature also impacts how much change is observed in the feature after a predetermined amount of processing of the part. So, selection of the feature can also be based on the type of processing, number of processes, and the shape of the feature to indicate what type of data can be obtained from the feature and also to indicate granularity (certain shape dimensions may remain unchanged or slightly changed while other shapes have greater changes which are more easily detected and interpreted).

In block 104 of FIG. 1, after the feature has been selected based on the desired information and/or granularity to be obtained from the feature, the feature along with the matrix 2D code is formed into the part as a modified matrix 2D code label. The formation of the label may be accomplished by molding the label into the part, machining the label into the part, etching (chemical and/or laser etching) the label into the part, and/or the like. In block 106, the part is then released to be used and put into circulation (e.g., sent to consumer for use in semiconductor processing, etc.). In block 108, the part is then retrieved from circulation. In some instances, the part may be used and then sent to a recycler who cleans the part and may then send the part back to the manufacturer dependent upon the part condition, etc. In block 110, the part is inspected to determine what changes have occurred for the feature and/or sub-features within the modified matrix 2D code label. In some instances, an optical scanner and/or metrology tools may be used to determine the changes to the feature. In some embodiments, the metrology tool may include a microscope or other optical magnification processes that utilize lenses or electronic apparatus to provide magnification of the feature. In other instances, a visual inspection may be used to determine the changes.

In block 112, the changes are analyzed to determine data relating to the condition of the part and may also include authentication of the part. The analysis may include processing of image data and/or metrology data and the like. The analysis may also leverage machine learning and artificial intelligence to infer data or recommendations for status of the part and/or authentication of the part and/or recommendations for feature augmentation to better indicate desired data and the like including shape, size, and location of the feature within the modified matrix 2D code label, etc. In block 114, the tracking information relating to the part is updated with the condition data. The condition data may include authentication data, number of processes undergone by the part, and status of the part as to whether or not the part is at end-of-life or can be reused. Data obtained from the part using the features may also be used to verify data provided by consumers and/or recyclers to ensure accurate information is available for the part. Remedial action may be taken if discrepancies exist such as altering warranty status and the like. The feature data can also include further coded data to assist in authenticating the part against a master part list to ensure that the part has not been altered for other uses or counterfeited.

Figure 9:
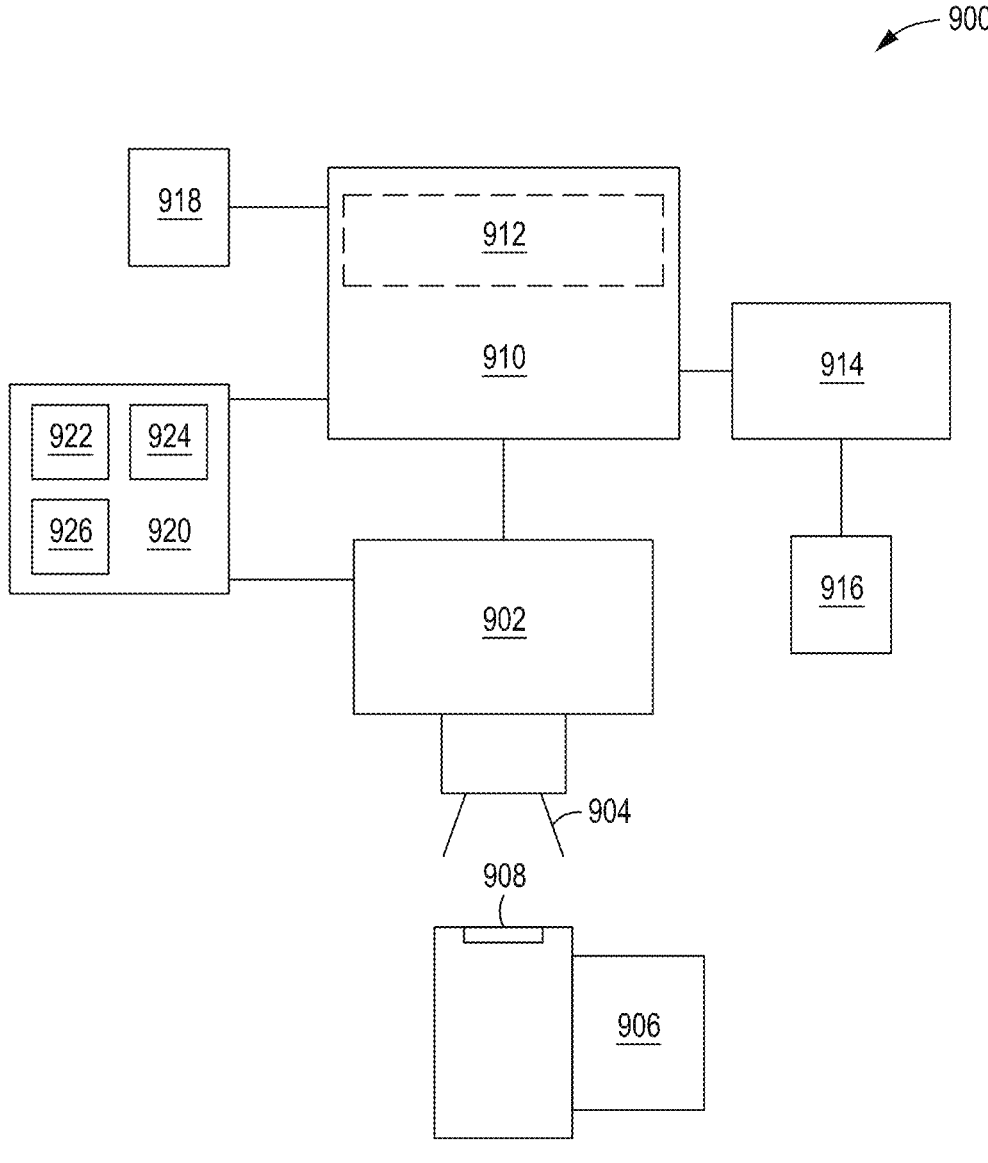
FIG. 9 is a cross-sectional view of a tracking system in accordance with some embodiments of the present principles.

FIG. 9 depicts a tracking system 900 for tracking parts according to the present techniques. The tracking system 900 includes a feature selection system 914 that determines feature attributes (e.g., size, shape, height, location, sub-features, granularity, end-of-life indicator, etc.) based on an intended and/or unintended usage of a part, etc. (e.g., intended usage per manufacturer's specifications, unintended usage such as exposure to certain chemicals and/or environments that may void warranty, etc.). The feature selection system 914 may interface with an analysis system 910 to obtain historical data and/or artificial intelligence inference data that may aid in the proper selection of the feature. The feature selection system 914 embeds the selected feature set (single feature or feature with sub-features and the like) into a matrix 2D code label to generate a modified matrix 2D code label. The modified matrix 2D code label is then sent to a part label generation system 916 that forms the modified matrix 2D code label into the part. The formation process of the label may include a milling process (machining or mechanical removal of material to form the label), a laser-based process (laser etching to remove material to form the label), and or other processes (e.g., pressing the label into the part, molding the label into the part (e.g., polymer materials)), and the like. The label can also be etched into the part using a pattern and chemicals and similar. The present techniques are not limited by the process used to form the label into the part or equipment. The part label generation system 916 may be located external to the tracking system 900.

The tracking system 900 has a metrology system 902 with optical capabilities 904 to image and/or read the modified matrix 2D label 908 after a part 906 has been in circulation or has been returned uncirculated (e.g., part broken/unwanted by user, etc. claimed as in new condition, verification required as to condition and authentication, etc.). The metrology system 902 optically scans the modified matrix 2D code label 908 to form image data from the modified matrix 2D code label 908. The data from the modified 2D code label 908 is sent from the metrology system 902 to the analysis system 910 to determine condition status, usage, authentication, and the like. The analysis system 910 may interface with an artificial intelligence system 912 that is internal and/or external to the analysis system 910. The analysis system 910 and the artificial intelligence system 912 may obtain data from the feature selection system 914, external data sources 918 (e.g., historical usage records, part production numbers, intended usage, etc.), a system controller 920, and/or other sources to aid in analyzing the changes of the feature and to determine what the changes indicate with regard to the part condition and/or authentication and the like. Inferences may be made as to how the part has been used and/or how a feature should be altered to allow for enhanced tracking of particular parts in the future. The inferred feature alteration information may be fed directly back into the feature selection system 914 by the analysis system 910 and/or by the artificial intelligence system 912.

The system controller 920 controls the operation of any of the systems of the tracking system 900 described herein. The system controller 920 may use a direct control of the tracking system 900, or alternatively, by controlling the computers (or controllers) associated with the tracking system 900. In operation, the system controller 920 enables data collection and feedback from the tracking system 900 to optimize performance of the tracking system 900 and to control the feature formation and tracking processes according to the methods described herein. The system controller 920 generally includes a central processing unit (CPU) 922, a memory 924, and a support circuit 926. The CPU 922 may be any form of a general-purpose computer processor that can be used in an industrial setting. The support circuit 926 is conventionally coupled to the CPU 922 and may comprise a cache, clock circuits, input/output subsystems, power supplies, and the like. Software routines, such as methods as described herein may be stored in the memory 924 and, when executed by the CPU 922, transform the CPU 922 into a specific purpose computer (controller 920). The software routines may also be stored and/or executed by a second controller (not shown) that is located remotely from the tracking system 900.

The memory 924 is in the form of computer-readable storage media that contains instructions, when executed by the CPU 922, to facilitate the operation of the semiconductor processes and equipment. The instructions in the memory 924 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for tracking of a semiconductor chamber part, comprising:

selecting a feature to embed into a matrix two-dimensional (2D) code label to create a modified matrix 2D code label, wherein the feature does not cause misreading of information from the matrix 2D code label when embedded into the matrix 2D code label and wherein the feature is configured to change based on treatment of the semiconductor chamber part; and forming the modified matrix 2D code label into the semiconductor chamber part.

2. The method of claim 1, further comprising:

optically inspecting the modified matrix 2D code label to determine changes to the feature; and analyzing the changes to the feature to determine a number of cleaning cycles undergone by the semiconductor chamber part based, at least in part, on the changes to the feature.

3. The method of claim 2, wherein optically inspecting the modified matrix 2D code label includes reviewing the modified matrix 2D code label with a naked eye, an optical microscope, or a metrology tool.

4. The method of claim 2, wherein analyzing the changes to the feature includes using a machine learning process to infer information regarding the number of cleaning cycles undergone by the semiconductor chamber part.

5. The method of claim 2, wherein analyzing the changes to the feature includes, at least in part, accounting for a type of chemical used in a cleaning cycle.

6. The method of claim 1, wherein selecting the feature is based, at least in part, on a type of chemical used in a cleaning cycle of the semiconductor chamber part.

7. The method of claim 1, wherein selecting the feature is based, at least in part, on a type of material of the semiconductor chamber part.

8. The method of claim 1, wherein the feature changes dimensionally with each cleaning cycle of the semiconductor chamber part.

9. The method of claim 1, wherein the feature comprises a plurality of sub-features, wherein a dimensional change in one or more of each individual sub-feature indicates a predetermined number of cleaning cycles.

10. The method of claim 1, wherein the feature is positioned at least on a plateau of the matrix 2D code label to form the modified matrix 2D code label.

11. The method of claim 1, wherein the feature is positioned at least one a recess of the matrix 2D code label to form the modified matrix 2D code label.

12. The method of claim 1, wherein the matrix 2D code label is a data matrix 2D bar code with ECC 200 error correction correctable with damage of 30% or less.

13. The method of claim 1, wherein the semiconductor chamber part is formed of silicon, silicon carbide, aluminum, anodized aluminum, aluminum nitride, stainless steel, anodized stainless steel, aluminum nitride, aluminum oxide, polyether ether ketone (PEEK), titanium, or quartz.

14. A method for tracking cleaning cycles of a semiconductor chamber part, comprising:

inspecting a modified matrix two-dimensional (2D) code label with a feature that does not cause misreading of information from the matrix 2D code label when embedded into the matrix 2D code label;

determining a change to the feature after the semiconductor chamber part has been used in a semiconductor process and subsequently cleaned; and determining a number of cleaning cycles undergone by the semiconductor chamber part based, at least in part, on the changes to the feature.

15. The method of claim 14, wherein inspecting the modified matrix 2D code label includes reviewing the modified matrix 2D code label with a naked eye, an optical microscope, or a metrology tool.

16. The method of claim 14, wherein determining the number of cleaning cycles includes using a machine learning process to infer information regarding the number of cleaning cycles undergone by the semiconductor chamber part based, at least in part, on the change to the feature.

17. The method of claim 14, wherein determining the number of cleaning cycles includes, at least in part, accounting for a type of chemical used in a cleaning cycle of the semiconductor chamber part or a type of material of the semiconductor chamber part.

18. The method of claim 14, wherein the feature changes dimensionally with each cleaning cycle of the semiconductor chamber part.

19. The method of claim 14, wherein the feature comprises a plurality of sub-features, wherein a dimensional change in one or more of each individual sub-feature indicates a predetermined number of cleaning cycles.

20. A non-transitory, computer readable medium having instructions stored thereon that, when executed, cause a method for tracking of a semiconductor chamber part to be performed, the method comprising:

selecting a feature to embed into a matrix two-dimensional (2D) code label to create a modified matrix 2D code label, wherein the feature does not cause misreading of information from the matrix 2D code label when embedded into the matrix 2D code label and wherein the feature is configured to change based on treatment of the semiconductor chamber part; and forming the modified matrix 2D code label into the semiconductor chamber part.

\* \* \* \* \*